(12) United States Patent
Lai et al.

(10) Patent No.: US 7,247,503 B2
(45) Date of Patent: Jul. 24, 2007

(54) METHOD OF LASER ANNEALING TO FORM AN EPITAXIAL GROWTH LAYER

(75) Inventors: Sheng C. Lai, Hsinchu (TW); Ruichen Liu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/794,357

(22) Filed: Mar. 4, 2004

(65) Prior Publication Data

US 2005/0059171 A1  Mar. 17, 2005

Related U.S. Application Data

(60) Provisional application No. 60/469,054, filed on May 7, 2003.

(51) Int. Cl.
*H01L 21/00* (2006.01)

(52) U.S. Cl. .......................... 438/3; 438/240; 438/393; 438/396

(58) Field of Classification Search ..................... None
See application file for complete search history.

(56) References Cited

U.S. PATENT DOCUMENTS

| | | | |
|---|---|---|---|
| 6,198,120 B1 * | 3/2001 | Sakurai et al. | 257/295 |
| 6,787,371 B2 * | 9/2004 | Sawasaki | 438/3 |
| 6,884,631 B2 * | 4/2005 | Sawasaki | 438/3 |
| 6,955,925 B1 * | 10/2005 | Donohue et al. | 438/3 |
| 2005/0213282 A1 * | 9/2005 | Kondo et al. | 361/311 |

OTHER PUBLICATIONS

M. C. Gower, "Industrial Applications of Pulsed Lasers to Materials Microprocessing," *SPIE's Symposium on 'High Power Laser Ablation,'* Apr. 1998 (15 total pages).

J. Cashmore et al., "High Resolution Micromachining Using Short Wavelength and Short Pulse Lasers" (2 total pages).

N. Rizvi, "Micro-Engineering Applications of Pulsed Lasers" (8 total pages).

P.P. Donohue and M.A. Todd, "Pulse-Extended Excimer Laser Annealing of Lead Zirconate Titanate Thin Films," *Integrated Ferroelectrics*, vol. 31 (2000), pp. 285-296.

N. Inoue et al, "Low thermal-budget fabrication of sputtered-PZT capacitor on multilevel interconnects for embedded FeRAM," *IEDM '00 Tech. Digest* (2000), pp. 797-800.

S. Kobayashi et al., "64Kbit CMVP FeRAM macro with reliable retention/imprint characteristics," *IEDM '00 Tech. Digest* (2000), pp. 783-786.

S.L. Lung et al., "Low Temperature Epitaxial Growth of PZT on Conductive Perovskite $LaNiO_3$ Electrode for Embedded Capacitor-Over-Interconnect (COI) FeRam Application," *IEDM '01 Tech. Digest* (2001), pp. 275-278.

* cited by examiner

*Primary Examiner*—Zandra V. Smith
*Assistant Examiner*—Khanh Duong
(74) *Attorney, Agent, or Firm*—Martine Penilla & Gencarella, LLP (57) ABSTRACT

A method for forming an epitaxial layer in a capacitor over interconnect structure, includes selecting a laser having a suitable wavelength for absorption at a seeding layer/annealing layer interface of the capacitor over interconnect structure, and directing laser energy from the selected laser at the capacitor over interconnect structure. The laser energy anneals a feature of the capacitor over interconnect structure to form an epitaxial layer. The annealing is accomplished at a temperature below about 450° C. The selected laser can be an excimer laser using a pulse extender. The capacitor over interconnect structure can be a ferroelectric capacitor formed over a conventional CMOS structure.

18 Claims, 8 Drawing Sheets

Before excimer laser annealing

FIG. 11A

After excimer laser annealing

METHOD OF LASER ANNEALING TO FORM AN EPITAXIAL GROWTH LAYER

CROSS REFERENCE To RELATED APPLICATIONS

This application claims priority from U.S. Provisional Patent Application No. 60/469,054, filed May 7, 2003, and entitled "METHOD OF LASER ANNEALING TO FORM EPITAXIAL GROWTH LAYER." The disclosure of the provisional application is incorporated herein by reference.

BACKGROUND OF THE INVENTION

1. Field of the Invention

The present invention relates generally to semiconductor manufacturing, and more particularly to a method of laser annealing to obtain epitaxial growth.

2. Description of the Related Art

Ferroelectric Random Access Memory (FeRAM) is an ideal memory for System on Chip (SoC) applications because of its low operating voltage, low power consumption and high writing speed. Manufacture of FeRAM structures, however, is problematic with realized backend process damage to the ferroelectric capacitor and contamination due to ferroelectric materials.

One approach to FeRAM manufacture is known as a COI (Capacitor Over Interconnect) process. In the COI process, the ferroelectric capacitor is fabricated after the CMOS interconnect process. The conventional CMOS process is undisturbed and thus integration of the ferroelectric capacitor becomes straightforward.

One challenge of the COI process is to achieve perovskite ferroelectric phase below about 450° C. Although several attempts have been reported, all generally suffer from either failing to achieve a low enough temperature, or degraded remnant polarization. What is therefore needed is a method to achieve the requisite material state at a low enough temperature and without degraded remnant polarization.

SUMMARY OF THE INVENTION

Broadly speaking, the present invention fills these needs by providing a method to grow an epitaxial layer by laser annealing. Embodiments of the present invention can be easily applied to semiconductor manufacturing, thin-film-transistor liquid-crystal-display (TFT-LCD) manufacturing, etc. An exemplary implementation for embodiments of the present invention includes the forming of an epitaxial growth ferroelectric capacitor using this invention for embedded FeRAM applications. The present invention can be implemented in numerous ways, including as a process, an apparatus, a system, a device, or a method.

In one embodiment, a method for forming an epitaxial layer in a capacitor over interconnect structure is provided. The method includes selecting a laser having a suitable wavelength for absorption at a seeding layer/annealing layer interface of the capacitor over interconnect structure. The method further includes directing laser energy from the selected laser at the capacitor over interconnect structure. The laser energy anneals a feature of the capacitor over interconnect structure to form an epitaxial layer.

In another embodiment, a method of selecting a laser for laser annealing a multi-layer feature is provided. The method includes determining a transmission, reflection, and absorption of laser energy across a wavelength spectrum for an uppermost layer of the multi-layer feature. The method further includes determining a transmission, reflection, and absorption of laser energy across a wavelength spectrum for a next layer adjacent to the uppermost layer of the multi-layer feature. An absorption percentage of laser energy across a wavelength spectrum at an interface between the uppermost layer and the next layer adjacent to the uppermost layer of the multi-layer feature is then calculated, and a laser is selected based on the calculated absorption percentage at a particular wavelength.

In a further embodiment, a method of making a capacitor over interconnect structure is provided. The method includes providing an interconnect structure, and fabricating a ferroelectric capacitor disposed over the interconnect structure. The fabricating of the ferroelectric capacitor disposed over the interconnect structure includes the processes of selecting a laser having a suitable wavelength for absorption at a seeding layer/annealing layer interface of the ferroelectric capacitor, and directing laser energy from the selected laser at the ferroelectric capacitor. The laser energy anneals a feature of the ferroelectric capacitor to form an epitaxial layer.

The advantages of the present invention over the prior art are numerous. To form an epitaxial growth layer by a low temperature process is important because this process is compatible with conventional CMOS processes or other fields, such as TFT-LCD. Because laser-annealing technique has an ultra-short annealing time (lower than 0.1 ms), it will not damage inner conventional CMOS interconnects and substrates.

Embodiments of the present invention provide a laser-annealing method to obtain a low temperature epitaxial growth layer. Embodiments of the invention also provide a method to select and to control a suitable laser to obtain or fabricate a low temperature epitaxial growth layer. Embodiments of the present invention can be widely implemented in many fields that utilize, or could benefit from the utilization of the process of forming an epitaxial layer at low temperature.

Other advantages of the invention will become apparent from the following detailed description, taken in conjunction with the accompanying figures, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

An invention for forming an epitaxial growth layer by a low temperature, laser annealing process is described. In preferred embodiments, a suitable laser is selected and then utilized to fabricate, for example, COI structures. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. The terms "about" and "approximately," as used herein, denote a value within +/−10% of the referenced value.

As is known, laser annealing can heat a surface to high temperature while leaving a bulk of materials at low temperature. Such properties cast laser annealing as an ideal technique to fabricate COI structures. In one embodiment of the present invention, a suitable laser system is first selected. In order to have an epitaxial growth layer, the interface between seeding layer and the layer that is to be annealed to form an epitaxial layer needs to be heated by a laser-annealing technique because the activation energy of heterogeneous nucleation at the interface between the seeding layer and the annealing layer is lower than that of homogenous nucleation in the annealing layer.

First, the transmission and reflection coefficients, which are expressed in one embodiment as percentages of a total laser energy, of the seeding layer and of the layer that will be crystallized are measured and then compared to laser wavelengths. It is thereby possible to determine a desired wavelength to achieve a maximum absorption at the seeding layer/annealing layer interface. The laser or laser system with this desired wavelength can then be selected for use to form an epitaxial growth layer.

Figure 1:
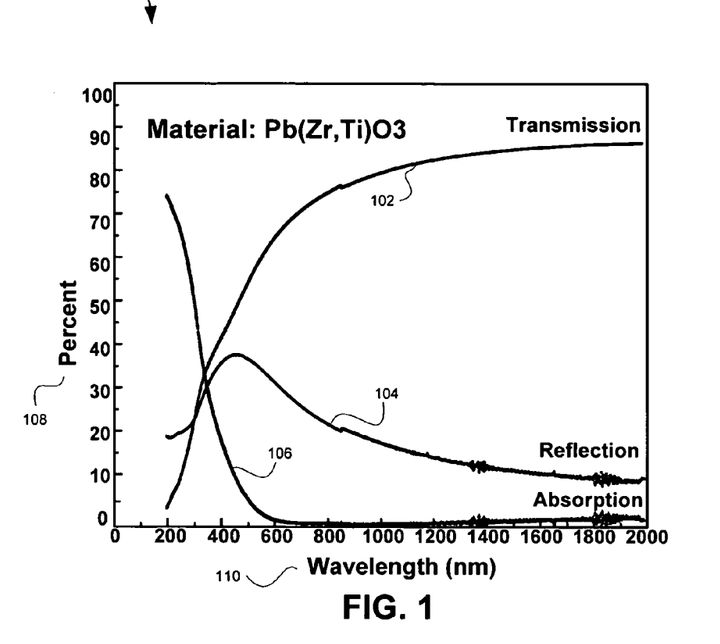
FIG. 1 is a graph showing the plots of the transmission, reflection, and absorption percentages across a spectrum of wavelengths for PZT, in accordance with one embodiment of the present invention.
Figure 2:
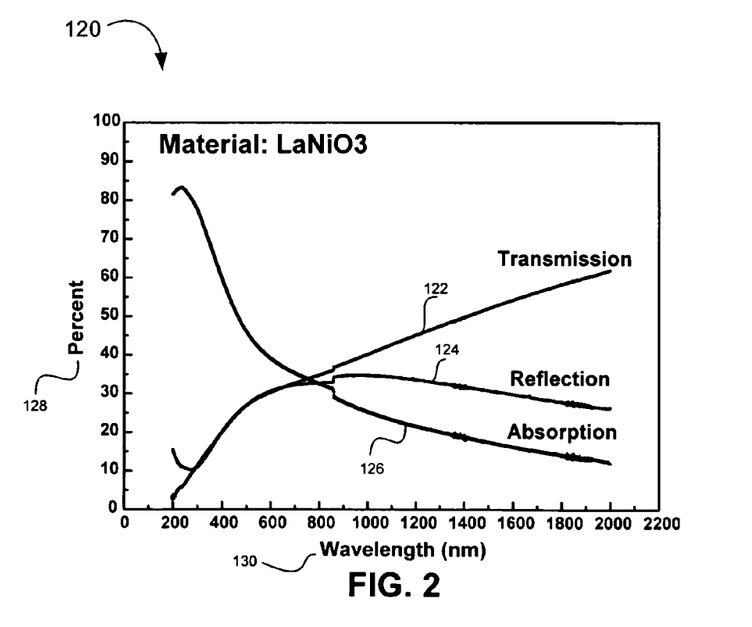
FIG. 2 is a graph showing the plots of the transmission, reflection, and absorption percentages across a spectrum of wavelengths for LNO, in accordance with one embodiment of the present invention.

FIGS. 1 and 2 illustrate this determination of desired wavelength for an appropriate laser or laser system using an exemplary Pb(Zr, Ti)O$_3$, also known as PZT, epitaxial layer and a seeding layer of LaNiO$_3$, also known as LNO. FIG. 1 is a graph 100 showing the plots of the transmission 102, reflection 104, and absorption 106 percentages 108 across a spectrum of wavelengths 110 for PZT, in accordance with one embodiment of the present invention. FIG. 2 is a graph 120 showing the plots of the transmission 122, reflection 124, and absorption 126 percentages 128 across a spectrum of wavelengths 130 for LNO, in accordance with one embodiment of the present invention. The relationships between and among transmission, reflection, and absorption, of PZT and LNO are illustrated in FIGS. 1 and 2.

Referring to FIGS. 1 and 2, assume the incident laser energy is equal to 100%. As is known, Transmission (T)+ Reflection (R)+Absorption (A)=100%. A known value of, or the ability to measure, any two of the T, R, and A values results in the ability to easily determine the third value. By way of example, T is typically known or easily measured, and R is easily measured, and therefore A is easily calculated. In FIG. 1, Transmission, Reflection and Absorption of PZT, also denoted in the instant application by $T_{PZT}$, $R_{PZT}$ and $A_{PZT}$, respectively, are shown expressed in percentages 108 plotted across a wavelength 110 spectrum. The same properties, T, R, and A, of LNO are determined in the same manner as described above for PZT, and are similarly described throughout the instant application as $T_{LNO}$, $R_{LNO}$ and $A_{LNO}$, respectively. If a structure is comprised of PZT (top layer)/LNO (seeding layer) in accordance with one embodiment of the present invention, then $(T_{PZT}*A_{LNO})$ will be absorbed at the interface of PZT and LNO. In another embodiment of the invention, the LNO seeding layer is formed over or on the top of PZT, and then the interface is annealed. It should be appreciated that epitaxial growth can also be achieved in the PZT layer. The calculation to determine the absorption at the interface of LNO and PZT in an embodiment in which the LNO seeding layer is formed over or on the top of PZT is $(T_{LNO}*A_{PZT})$.

The absorption at the interface of LNO and PZT, together with the power, wavelength, and other characteristics of the laser are then used to select a proper laser for a particular application. In one embodiment, this is an approximate calculation, however it is sufficient to determine a suitable laser for particular materials or applications.

Figure 3:
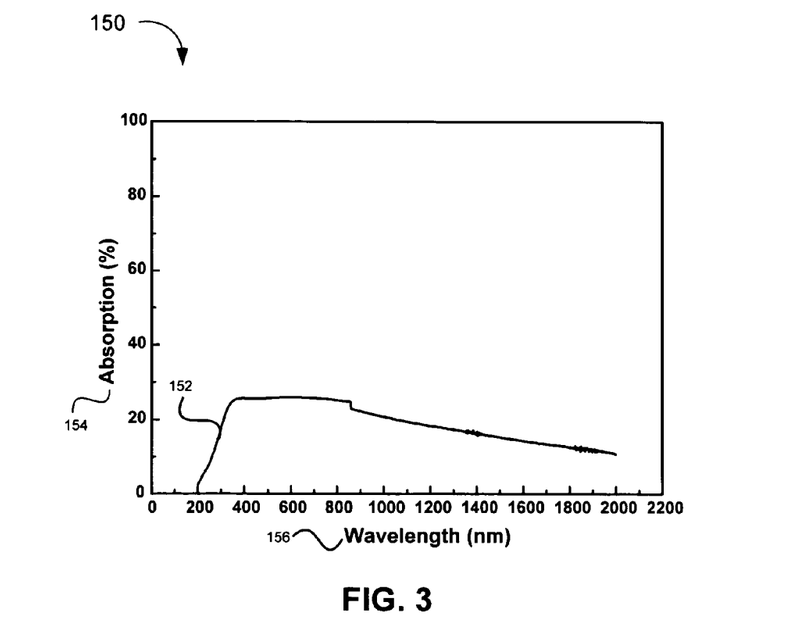
FIG. 3 is a graph showing a plot of the resulting calculation for the absorption expressed as a percentage at the PZT/LNO interface across essentially the same laser wavelength spectrum used in FIGS. 1 and 2, in accordance with one embodiment of the invention.

FIG. 3 is a graph 150 showing a plot 152 of the resulting calculation for the absorption expressed as a percentage 154 at the PZT/LNO interface across essentially the same laser wavelength 156 spectrum used in FIGS. 1 and 2, in accordance with one embodiment of the invention. The plot 152 of the absorption percentage 154 of laser energy at the PZT and LNO interface of the exemplary structure as shown in FIG. 3 is obtained by calculating $(T_{PZT}*A_{LNO})$ across the wavelength 156 spectrum in accordance with an embodiment of the invention. In one embodiment of the invention, a maximum absorption of laser energy at the interface between the seeding layer and the annealing layer is preferred for the laser annealing process. In the exemplary PZT/LNO structure, a wavelength 156, from 385 nm to 800 nm may be suitable, as illustrated in FIG. 3, and is selected for this exemplary application.

Figure 4:
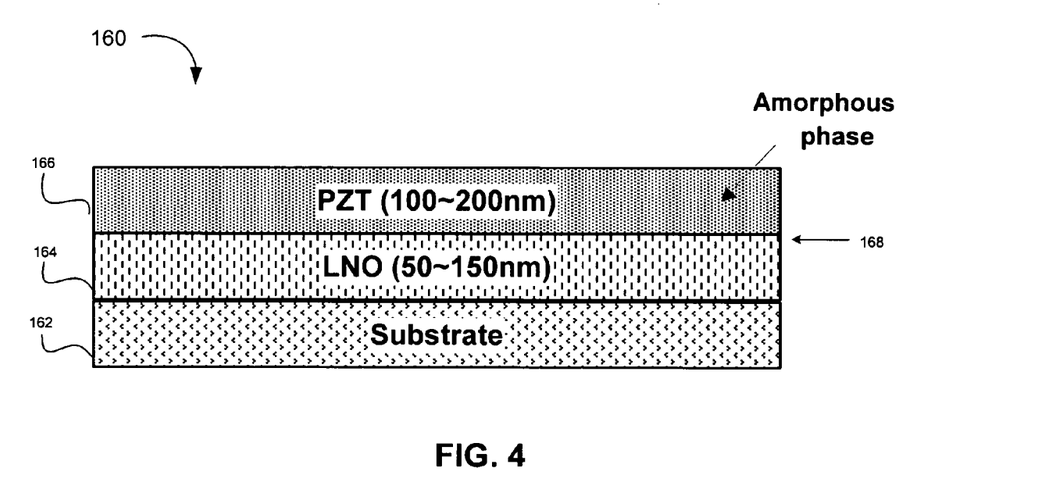
FIG. 4 illustrates a first step of the process flow, which is to deposit a PZT film on an LNO seeding layer at room temperature, in accordance with one embodiment of the invention.
Figure 5:
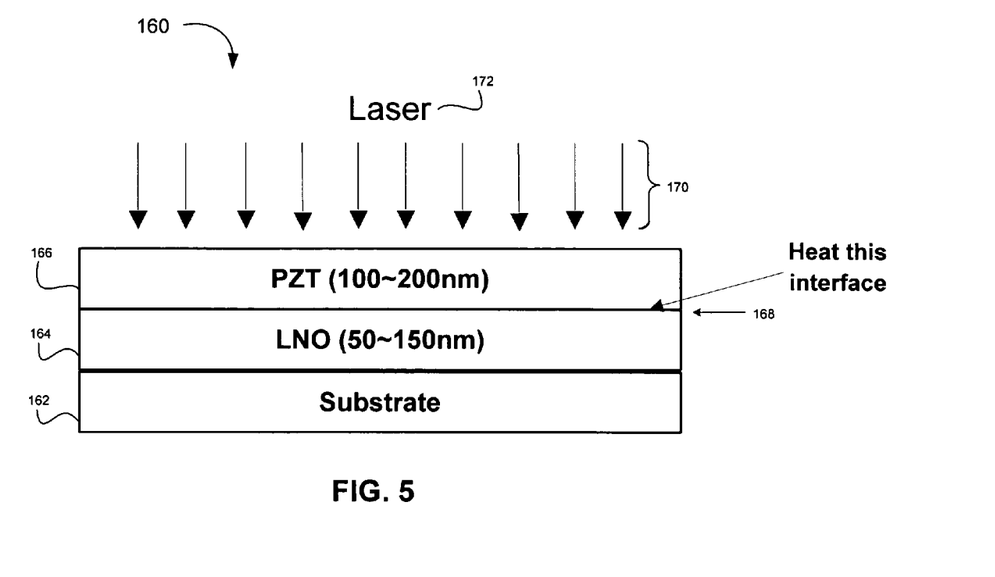
FIG. 5 shows energy from the selected laser system applied to the exemplary structure to heat the PZT/LNO interface, in accordance with one embodiment of the invention.
Figure 6:
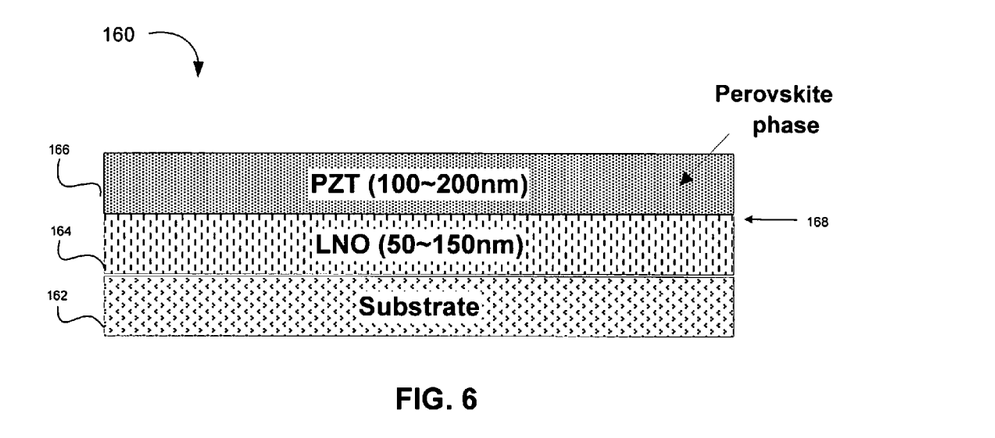
FIG. 6 illustrates the exemplary structure with the PZT epitaxially grown on LNO seeding layer, in accordance with an embodiment of the invention.

A detailed process flow according to one embodiment of the invention is illustrated in FIGS. 4-6. FIG. 4 illustrates a first step of the process flow, which is to deposit a PZT film 166 on an LNO seeding layer 164 at room temperature, in accordance with one embodiment of the invention. FIG. 4 shows an exemplary structure 160 having a substrate 162 over which is deposited an LNO seeding layer 164. The PZT film 166 is deposited over the LNO seeding layer 164, in accordance with one embodiment of the invention. In one embodiment of the invention, the LNO seeding layer 164 has a thickness ranging from approximately 50 nm to approximately 150 nm, and the PZT film 166 has a thickness ranging from approximately 100 nm to approximately 200 nm. The PZT film 166, deposited at room temperature, is preferably amorphous. The PZT/LNO interface is shown at 168.

Next, as illustrated in FIG. 5, a suitable laser system 172, selected in one embodiment in accordance with a desired absorption at the PZT/LNO interface 168 as described above, is utilized to form epitaxial growth in the PZT layer 166. FIG. 5 shows energy 170 from the selected laser system 172 applied to the exemplary structure 160 to heat the PZT/LNO interface 168, in accordance with one embodiment of the invention.

FIG. 6 illustrates the exemplary structure 160 with the PZT 166 epitaxially grown on LNO seeding layer 164, in accordance with an embodiment of the invention. FIG. 6 shows the exemplary structure 160 with the substrate 162, over which has been formed the LNO layer 164. The PZT film 166 was deposited over the LNO layer 164 at room temperature, and then heated with a selected laser 172 to heat the PZT/LNO interface 168 as described above, and resulting in the PZT layer 166 now in a perovskite phase.

The specifications of a suitable laser system and annealing conditions in accordance with one embodiment of the present invention are as shown below in Table 1. It should be noted that the laser pulse duration can be assisted by a pulse extender to achieve the desired pulse duration in accordance with known laser processes and procedures, and as described in further detail below.

TABLE 1

| Laser specifications or annealing conditions | Range |
| --- | --- |
| Wavelength of lasers | 385~800 nm |
| Laser pulse duration (Can be assisted by pulse extender) | 0.5 μs~100 μs |
| Laser energy density per pulse (mJ/cm$^2$) | 250 mJ/cm$^2$~10000 mJ/cm$^2$ |
| Number of shots | 1~10000 shots |
| Substrate assisted temperature | Room temperature ~450° C. |

In one embodiment of the invention, an excimer laser and a pulse-extending apparatus and technique can be utilized to achieve the desired annealing process. A typical pulse from excimer lasers is too short in duration (10–30 ns) to achieve desired annealing conditions because it does not allow the film adequate time to transform into the perovskite phase. With an extended pulse, top and bottom portions of the PZT film are both heated, and for a much longer time than in non-pulse-extended processes. Therefore, an extended pulse offers both more uniform heating and a longer heating time to complete crystallization into the desired perovskite phase.

Figure 7:
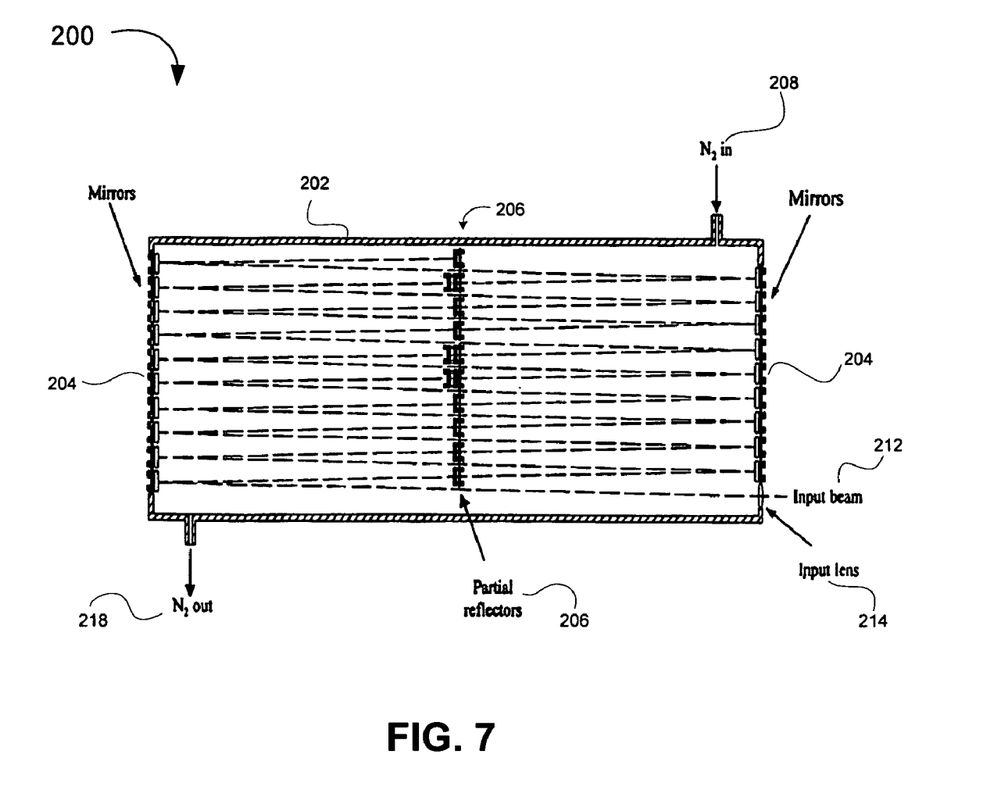
FIG. 7 illustrates a schematic of a pulse extender utilized to achieve the desired conditions, in accordance with one embodiment of the present invention.

FIG. 7 illustrates a schematic 200 of an exemplary pulse extender utilized to achieve the desired conditions, in accordance with one embodiment of the present invention. In FIG. 7, a pulse extender 200 is illustrated as a simple optical apparatus that can be implemented in a chamber or box 202 having banks of mirrors 204 along parallel, opposing sides. Nitrogen is introduced 208 into box 202 and maintained at a desired and appropriate pressure, temperature, etc. Nitrogen exits box 202 through nitrogen output 218. A plurality of partial reflectors 206 is disposed as illustrated between the parallel opposing banks of mirrors 204. An input beam 212 is introduced into the chamber 202 through an input lens 214. Using a pulse extender 200, the effective pulse duration of a laser, for example, is increased by extending the path lengths of laser beam 212 after passing through each of the plurality of partial reflectors 206. Exemplary pulse extending apparatus and techniques such as that illustrated in FIG. 7 are available from Exitech Ltd., Oxford, United Kingdom.

FIG. 7 illustrates a schematic 200 of an exemplary pulse extender utilized to achieve the desired conditions, in accordance with one embodiment of the present invention. In FIG. 7, a pulse extender 200 is illustrated as a simple optical apparatus that can be implemented in a chamber or box 202 having banks of mirrors 204 along parallel, opposing sides. Nitrogen is introduced through 208 into box 202 and maintained at a desired and appropriate pressure, temperature, etc. Nitrogen exits box 202 through nitrogen output 218. A plurality of partial reflectors 206 is disposed as illustrated between the parallel opposing banks of mirrors 204. An input beam 212 is introduced into the chamber 202 through an input lens 214. Using a pulse extender 200, the effective pulse duration of a laser, for example, is increased by extending the path lengths of laser beam 212 after passing through each of the plurality of partial reflectors 206. Exemplary pulse extending apparatus and techniques such as that illustrated in FIG. 7 are available from Exitech Ltd., Oxford, United Kingdom.

Figure 8:
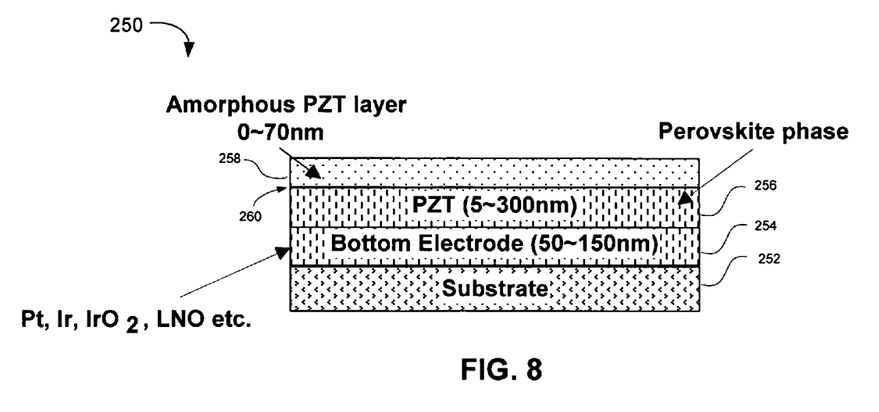
FIG. 8 shows a structure having an amorphous PZT layer formed over the top of a multi-layer feature resulting from etching damage or other process anomaly.

FIG. 8 shows a structure 250 having an amorphous PZT layer 258 formed over the top of a multi-layer feature resulting from etching damage or other process anomaly. As shown in FIG. 8, the multi-layer feature includes a substrate 252 over which is formed a bottom electrode layer 254. A PZT film 256 is formed over the bottom electrode layer 254, and an amorphous PZT layer 258 has formed over PZT film 256. In one embodiment, bottom electrode layer 254 ranges from approximately 50 nm to approximately 150 nm in thickness, and is comprised of such exemplary materials as platinum (Pt), iridium (Ir), iridium oxide (IrO$_2$), LNO, or other similar material. PZT film 256, in one embodiment, is formed to a thickness ranging from approximately 5 nm to approximately 300 nm. In the illustrated embodiment, PZT film 256 is formed in a perovskite phase, and PZT layer 258 is amorphous and has a thickness approaching zero and ranging to approximately 70 nm. An interface between PZT film 256 and amorphous PZT layer 258 is identified at 260. In accordance with an embodiment of the invention, structure 250 can be laser annealed by an excimer laser with a pulse extender.

Figure 9:
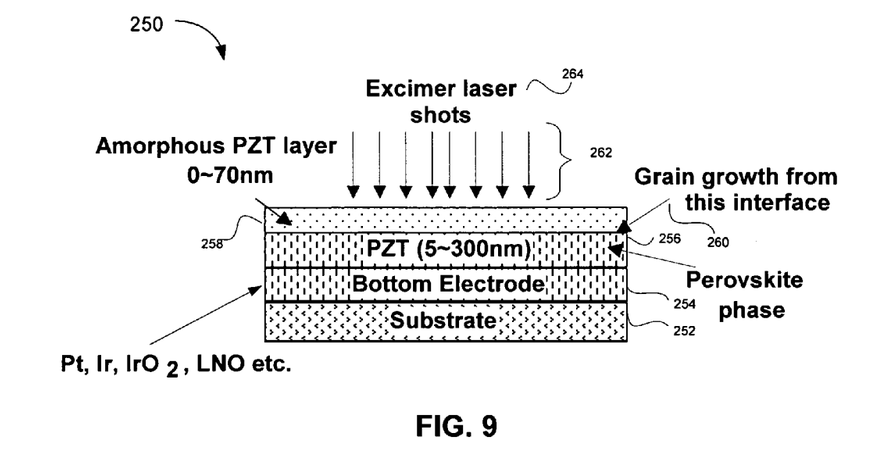
FIG. 9 illustrates laser annealing of structure shown in FIG. 8, in accordance with one embodiment of the present invention.

FIG. 9 illustrates laser annealing of structure 250 shown in FIG. 8, in accordance with one embodiment of the present invention. As shown in FIG. 9, an excimer laser 264, having pulse extending apparatus and techniques to achieve a desired wavelength as described above and selected in accordance with the process illustrated and described above in reference to FIGS. 1–3, is directed at structure 250. In the illustrated embodiment, absorption is calculated for the interface between PZT film 256 and amorphous PZT layer 258 at 260. Excimer laser energy 262 is directed at structure 250 to heat interface 260 between perovskite PZT film 256 and amorphous PZT layer 258.

Figure 10:
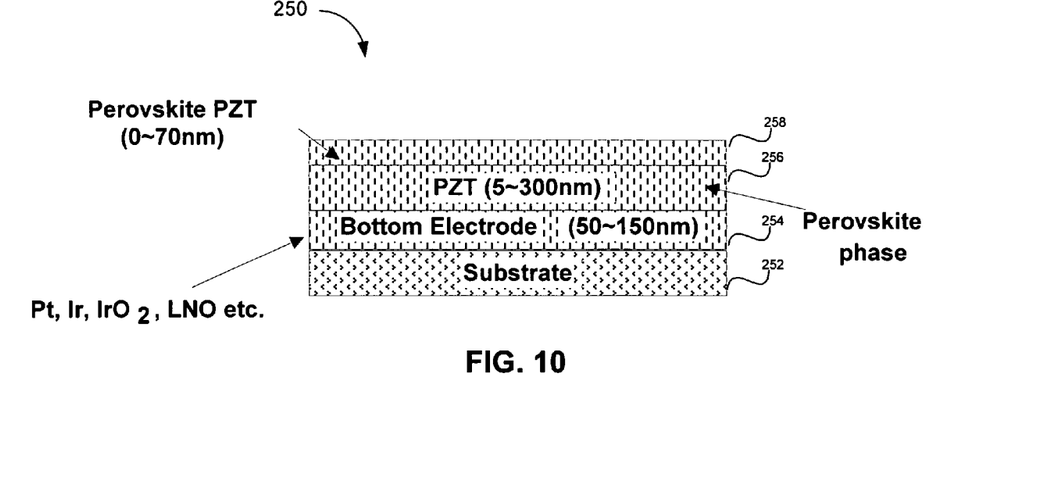
FIG. 10 shows the multi-layer feature of FIGS. 8 and 9 following the laser annealing, in accordance with an embodiment of the invention.

FIG. 10 shows structure 250 of FIGS. 8 and 9 following the laser annealing, in accordance with an embodiment of the invention. The amorphous PZT layer 258 shown in FIG. 9 has been crystallized into perovskite phase by application of an excimer laser.

Figure 11A:
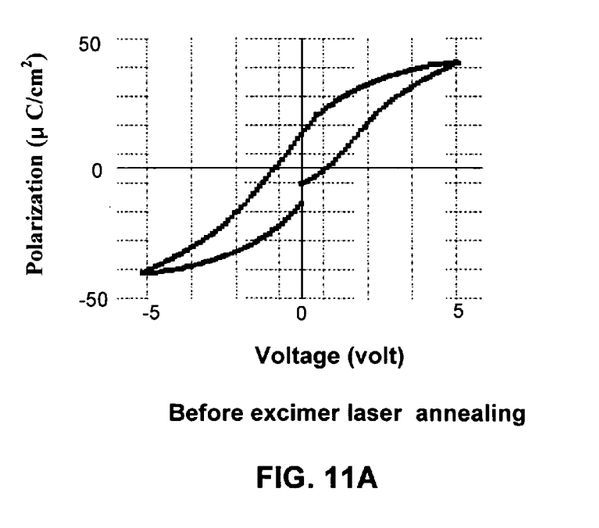
FIG. 11A shows a graph of remnant polarization before laser annealing with an excimer laser.
Figure 11B:
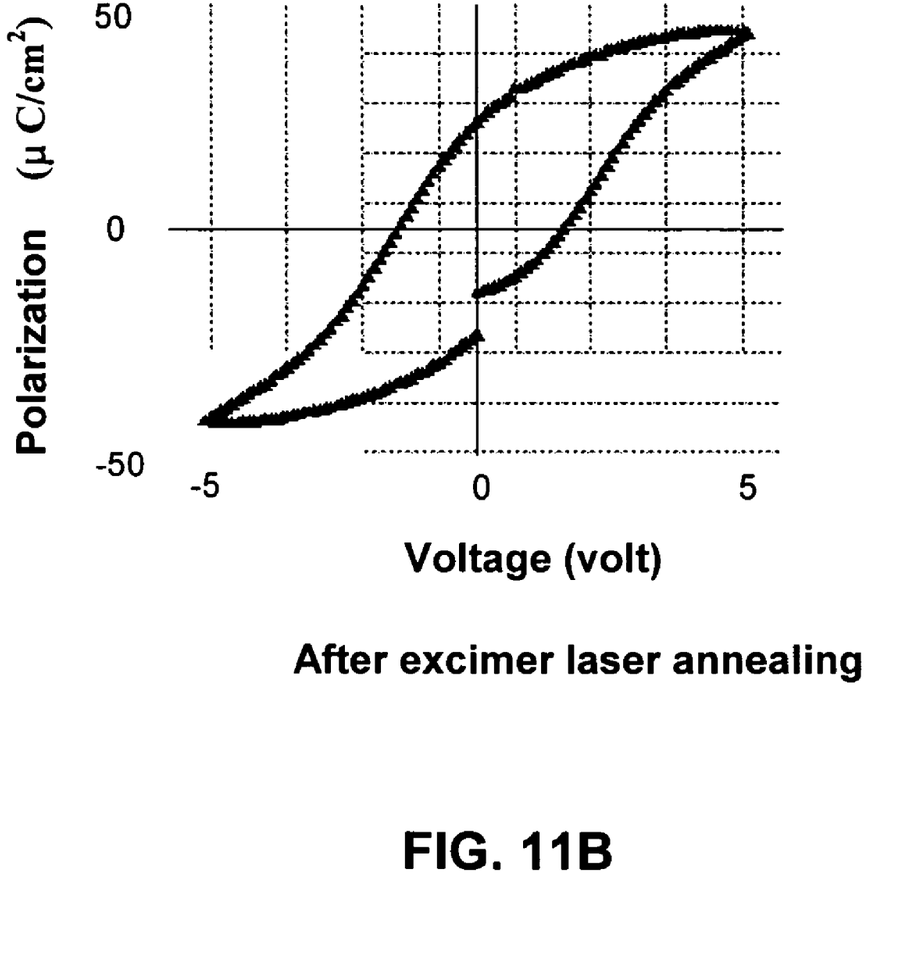
FIG. 11B shows a graph of remnant polarization after laser annealing with an excimer laser.

In accordance with embodiments of the present invention, remnant polarization is markedly improved by excimer laser annealing. The digital signal of FeRAM is stored in the ferroelectric capacitor, and the magnitude of the sensing window of FeRAM is proportional to the remnant polarization of the ferroelectric capacitor. A laser annealing process in accordance with embodiments of the present invention can therefore improve the sensing window of FeRAM. FIGS. 11A and 11B illustrate the realized improvement in remnant polarization.

FIG. 11A shows the remnant polarization before laser annealing with an excimer laser, and FIG. 11B shows the remnant polarization after laser annealing with an excimer laser. The remnant polarization of a ferroelectric capacitor is dependent on the amount of perovskite phase of the ferroelectric film, such as PZT. In FIG. 11A, the ferroelectric film, PZT, is not fully crystallized into perovskite phase so that the remnant polarization shown in FIG. 11A is smaller than that shown in FIG. 11B.

As shown in FIG. 11B, the ferroelectric film, PZT, is almost fully crystallized into perovskite phase by using laser annealing techniques, in accordance with embodiments of the present invention, so that the remnant polarization shown in FIG. 11B is larger than that shown in FIG. 11A.

The specifications of laser system and annealing conditions for the crystallization of a thin amorphous PZT layer formed over a perovskite PZT film are as shown below in Table 2.

TABLE 2

| Laser specifications or annealing conditions | Range |
| --- | --- |
| Wavelength of lasers | 157~351 nm |
| Laser pulse duration (Assisted by pulse extender) | 0.1 μs~10 μs |
| Laser energy density per pulse (mJ/cm$^2$) | 150 mJ/cm$^2$~1000 mJ/cm$^2$ |
| Number of shots | 1~10000 shots |
| Substrate assisted temperature | Room temperature ~450° C. |

Figure 12:
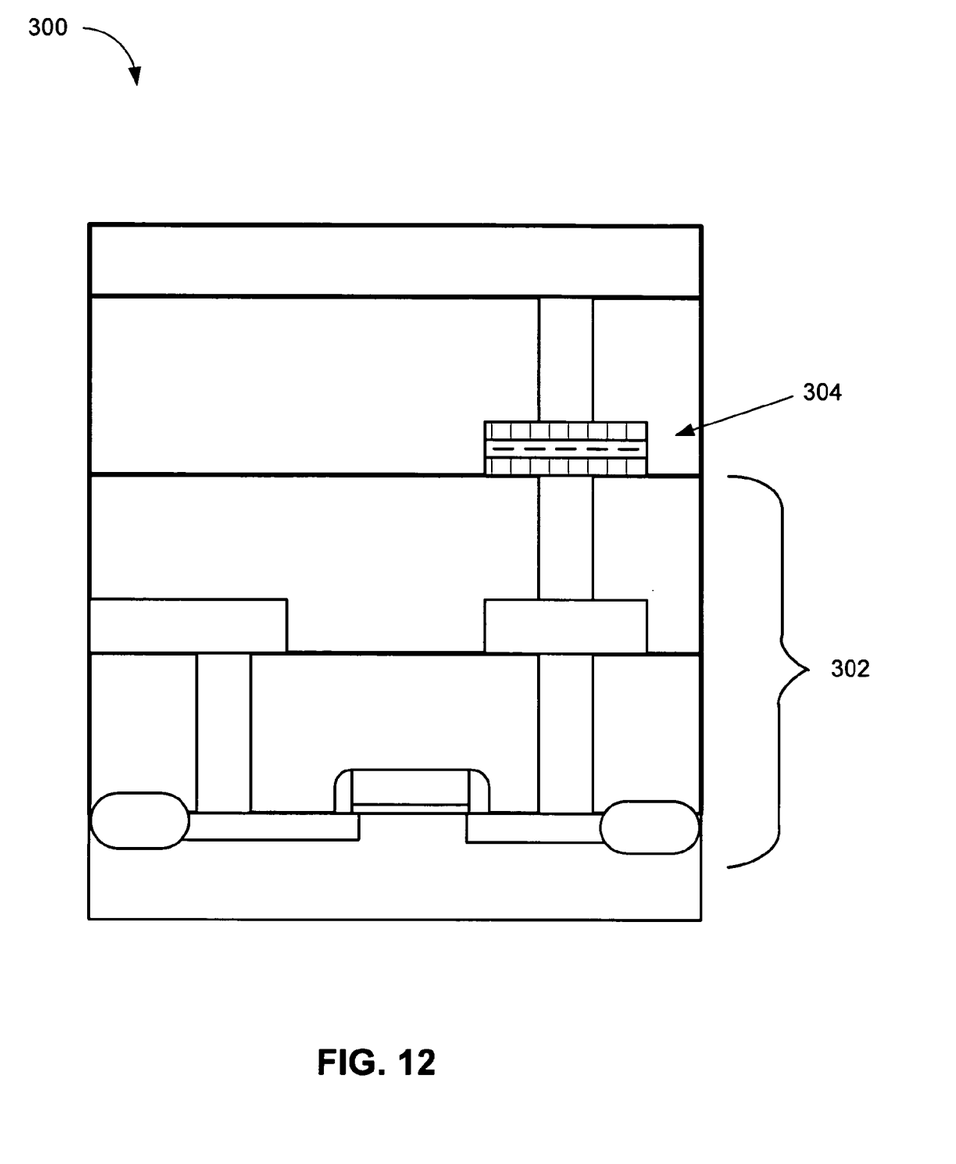
FIG. 12 shows a capacitor over interconnect structure formed in accordance with an embodiment of the present invention.

As described above, an exemplary implementation for embodiments of the present invention includes utilization to form COI structures. FIG. 12 shows a capacitor over interconnect structure 300 formed in accordance with an embodiment of the present invention. As shown in FIG. 12, the exemplary COI structure 300 includes a lower portion 302 having structures formed by conventional CMOS processes. Ferro-capacitor 304 is formed in accordance with embodiments of the present invention as described throughout the instant application. In one embodiment, ferro-capacitor 304 is formed after the fabrication of the conventional CMOS structures in region 302, leaving the conventional CMOS process undisturbed. An epitaxial layer has been grown by laser annealing as described herein, to achieve the desired perovskite ferroelectric phase below 450° C., and enabling fabrication of FeRAM structures.

In summary, embodiments of the present invention provide for the formation of epitaxial growth layers by a laser annealing technique. Embodiments of the present invention have been illustrated by exemplary multi-layer structures such as a PZT film deposited over LNO seeding layer, and it should be understood that the structure is exemplary and not limiting or exclusive. In one embodiment, the low temperature COI process is suitable for embedded FeRAM for SoC application Embodiments of the method also can be applied to other crystallization processes, such as BLT, SBT, and other similar materials and processes. Laser-annealing recipes of amorphous PZT formed over an LNO seeding layer are shown in table 1. The laser-annealing recipes shown in table 2 are for the crystallization of thin amorphous PZT layer on the top of a perovskite PZT film.

Embodiments of the present invention provide for the formation of an epitaxial layer without damaging underlying CMOS interconnects or substrate. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for forming an epitaxial layer over a seeding layer in a capacitor being formed over an interconnect structure, comprising:

providing the seeding layer and an annealing layer of the capacitor being formed over the interconnect structure, wherein the annealing layer is in an amorphous phase and is disposed over the seeding layer, and a seeding layer/annealing layer interface is defined between the seeding layer and the annealing layer;

selecting a laser having a desired wavelength for maximum absorption at the seeding layer/annealing layer interface of the capacitor being formed over the interconnect structure; and directing laser energy from the selected laser at the annealing layer of the capacitor being formed over the interconnect structure, wherein the laser energy is directed at the annealing layer of the capacitor being formed over the interconnect structure until the annealing layer of the capacitor being formed over the interconnect structure is annealed from the amorphous phase to form an epitaxial layer over the seeding layer in one single step.

2. The method of claim 1, wherein the selecting of the laser includes determining a laser absorption at the interface between the seeding layer and the annealing layer during the capacitor being formed over the interconnect structure.

3. The method of claim 1, wherein the directing of the laser energy includes targeting the laser energy at the interface between the seeding layer and the annealing layer during the capacitor being formed over the interconnect structure.

4. The method of claim 1, wherein the annealing of the annealing layer of the capacitor being formed over the interconnect structure is accomplished at a temperature below about 450° C. to form the epitaxial layer.

5. The method of claim 2, wherein the determining of the laser absorption at the interface between the seeding layer and the annealing layer includes determining the laser absorption across a spectrum of wavelengths.

6. The method of claim 5, wherein the determining of the laser absorption at the interface between the seeding layer and the annealing layer includes selecting the laser based on the determined laser absorption at an interface between the seeding layer and the annealing layer across the spectrum of wavelengths.

7. The method of claim 1, wherein the selected laser includes an excimer laser.

8. The method of claim 7, wherein the directing of laser energy includes using a pulse extender with the selected laser.

9. A method of making a capacitor over an interconnect (COI structure, comprising:

providing an interconnect structure; and fabricating a ferroelectric capacitor disposed over the interconnect structure, the fabricating including the processes of:
- providing a seeding layer and an annealing layer over the seeding layer with a seeding layer/annealing layer interface defined between the seeding layer and the annealing layer, wherein the annealing layer is in an amorphous phase;
- selecting a laser having a desired wavelength for maximum absorption at the seeding layer/annealing layer interface of the ferroelectric capacitor; and
- directing laser energy from the selected laser at the annealing layer, the laser energy being directed at the annealing layer until the annealing layer is annealed from the amorphous phase to form an epitaxial layer over the seeding layer in one single step.

10. The method of claim 9, wherein the selecting of the laser having the desired wavelength for maximum absorption at the seeding layer/annealing layer interface includes determining the absorption at the seeding layer/annealing layer interface across a wavelength spectrum.

11. The method of claim 9, wherein the directing of the laser energy includes using a pulse extender.

12. The method of claim 9, wherein the selected laser includes an excimer laser.

13. The method of claim 9, wherein the annealing of the annealing layer to form the epitaxial layer is accomplished at a temperature below about 450° C.

14. A method for forming an epitaxial layer over a seeding layer in a capacitor being formed over an interconnect structure, comprising:
- selecting a laser having a desired wavelength for maximum absorption at a seeding layer/annealing layer interface of the capacitor being formed over the interconnect structure, wherein the seeding layer/annealing layer interface is defined between the seeding layer and an annealing layer disposed over the seeding layer of the capacitor being formed, and the annealing layer is in an amorphous phase; and
- directing laser energy from the selected laser at the capacitor being formed over the interconnect structure to heat the seeding layer/annealing layer interface during the forming of the capacitor being formed over the interconnect structure,
wherein the laser energy anneals the annealing layer over the seeding layer of the capacitor being formed over the interconnect structure from the amorphous phase to form an epitaxial layer over the seeding layer in one single step.

15. The method of claim 14, wherein the selecting of the laser includes determining a laser absorption at the seeding layer/annealing layer interface during the forming of the capacitor being formed over the interconnect structure.

16. The method of claim 14, wherein the annealing of the annealing layer over the seeding layer of the capacitor being formed over the interconnect structure is accomplished at a temperature below about 450° C. to form the epitaxial layer over the seeding layer.

17. The method of claim 14, wherein the selected laser includes an excimer laser.

18. The method of claim 14, wherein the directing of laser energy includes using a pulse extender with the selected laser.

* * * * *